US009532489B2

(12) United States Patent
Mabuchi et al.

(10) Patent No.: US 9,532,489 B2
(45) Date of Patent: Dec. 27, 2016

(54) POWER CONVERSION DEVICE

(71) Applicant: Hitachi, Ltd., Chiyoda-ku, Tokyo (JP)

(72) Inventors: Yuuichi Mabuchi, Tokyo (JP); Tetsuya Kawashima, Tokyo (JP); Daisuke Matsumoto, Tokyo (JP); Akira Mima, Tokyo (JP); Yukio Hattori, Tokyo (JP); Hiroshi Kamizuma, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/750,302

(22) Filed: Jun. 25, 2015

(65) Prior Publication Data
US 2016/0007507 A1 Jan. 7, 2016

(30) Foreign Application Priority Data

Jul. 3, 2014 (JP) ................................. 2014-137411

(51) Int. Cl.
*H05K 7/20* (2006.01)

(52) U.S. Cl.
CPC ...... *H05K 7/20909* (2013.01); *H05K 7/20936* (2013.01)

(58) Field of Classification Search
CPC . H05K 7/20154; H05K 7/20336; H01L 23/40; H01L 35/04; H01L 35/32; H02M 7/003
See application file for complete search history.

(56) References Cited

U.S. PATENT DOCUMENTS

| 8,109,322 B2* | 2/2012 | Huang ................ F28D 15/0266 165/80.3 |
|---|---|---|
| 2004/0109293 A1* | 6/2004 | Apfelbacher ........ H01H 50/021 361/709 |
| 2006/0007720 A1* | 1/2006 | Pfeifer ............... H05K 7/20927 363/141 |
| 2007/0053154 A1* | 3/2007 | Fukuda ................ G11B 33/022 361/679.33 |
| 2009/0266518 A1* | 10/2009 | Huang ................ F28D 15/0266 165/104.19 |
| 2012/0039732 A1* | 2/2012 | Chang ................... F04D 25/082 417/423.8 |
| 2012/0162912 A1* | 6/2012 | Kim ................... H05K 7/20909 361/692 |

FOREIGN PATENT DOCUMENTS

JP 2011-120358 A 6/2011

* cited by examiner

*Primary Examiner* — Courtney Smith
*Assistant Examiner* — Michael Matey
(74) *Attorney, Agent, or Firm* — Crowell & Moring LLP (57) ABSTRACT

A power conversion device capable of reducing a temperature variation between a plurality of semiconductor modules is provided. The power conversion device comprises condensers 121, 122, a plurality of semiconductor modules 101, 102, heat dissipation units 103 to 109, a bus bar 140 connecting the condensers 121, 122 with the plurality of the semiconductor modules 101, 102, and a ventilation unit having cool wind blow. The power conversion module has features that the plurality of semiconductor modules 101, 102 are arranged apart from the condensers 121, 122 and in a line in a longitudinal direction of the bus bar 140 and that the cool wind 150 blows in a direction from the condensers 121, 122 toward the plurality of semiconductor modules 101, 102 that are mounted.

9 Claims, 5 Drawing Sheets

POWER CONVERSION DEVICE

CROSS REFERENCE TO RELATED APPLICATION

This application claims priority from Japanese Patent Application No. 2014-137411 filed on Jul. 3, 2014, the entire specification, claims and drawings of which are incorporated herein by reference.

BACKGROUND OF THE INVENTION

1. Field of Invention

The present invention relates to a power conversion device.

2. Description of the Related Art

A power conversion device is a device to convert electrical power and configured to convert any of AC and DC electrical power to the other or alter a frequency of electrical power by controlling switching operation of semiconductor elements included in the power conversion device such as Insulated Gate Bipolar Transistor (IGBT). There is a loss generated by switching on and off these semiconductor elements and having an electrical current flowing through these semiconductor elements. If a temperature of the semiconductor element becomes higher than a threshold operation temperature of the semiconductor device due to heat from the loss, the semiconductor device is not capable of stopping the current from flowing by its switching operation and the power conversion device could break in the worst case. Therefore it is necessary to appropriately cool the power conversion device while it is in operation.

There are plural semiconductor elements provided in a semiconductor module installed in the power conversion device. The power conversion device usually includes plural semiconductor modules which are connected in parallel with each other. It is desirable to keep temperatures of the semiconductor modules equal to each other when the temperatures of the semiconductor modules rise while the power conversion device is in operation. If there is a variation in the raised temperature between the semiconductor modules, a semiconductor module that is heated to a higher temperature than the others cannot be used longer than the others, which results in the power conversion device being less reliable.

As for cooling semiconductor modules included in the power conversion device, JP2011-120358A discloses "a power conversion device" comprising plural semiconductor modules each of which includes a switching device, a cooling device for cooling the plural semiconductor devices, and a condenser connected with the plural semiconductor devices, wherein one of the plural semiconductor modules that dissipates less heat than the others has the switching device either having a lowest gate resistance or base resistance, or having a lowest inductance on a current passage between the switching device and the condenser and a highest gate voltage or base voltage (See claim 1 of JP2011-120358A).

SUMMARY OF THE INVENTION

The power conversion device (power conversion device) as described in JP2011-120358A is intended to reduce the temperature variation among the semiconductor modules by using a switching device with the lowest gate resistance for one of the semiconductor modules that dissipates least heat and designing the current passage between the one of the semiconductor modules and the condenser to have the lowest inductance.

However, if such plural semiconductor modules as have various switching devices which differ in the gate resistance from one another are used, as is the case with the power conversion device (power conversion device) described for in JP2011-120358A, the number of components increases. As a result, productivity lowers and it is more difficult to maintenance such power conversion devices. In addition, if the loop inductance between the condenser and one of the semiconductor modules that dissipate least heat is made lowest, a loss while an electrical current is flowing becomes higher although a loss due to the voltage jumping up on switching decreases. Therefore, the total loss could be larger for some frequencies.

The objective of the present invention is to provide a power conversion device in which the temperature variation among the plural semiconductor modules is reduced.

In order to achieve the objective, the power conversion device of the present invention comprises a condenser, a plurality of semiconductor modules, a heat dissipation unit for cooling the plurality of the semiconductor modules collectively, a bus bar connecting the condenser with the plurality of semiconductor modules and a ventilation unit having cool wind blow, wherein the plurality of semiconductor modules are arranged apart from the condenser and in a line in a longitudinal direction of the bus bar, and the cool wind blows in a direction from the condenser toward the plurality of semiconductor module that are mounted.

The power conversion device according to the present invention is capable of reducing the temperature variation among the plural semiconductor module.

DETAILED DESCRIPTION OF THE INVENTION

Hereinafter, embodiments to practice the present invention are explained in detail with reference to appropriate figures that are attached. Identical signs used among plural figures indicate a component commonly used and a duplicate explanation for the component is omitted.

First Embodiment

Power Conversion Device

Figure 1:
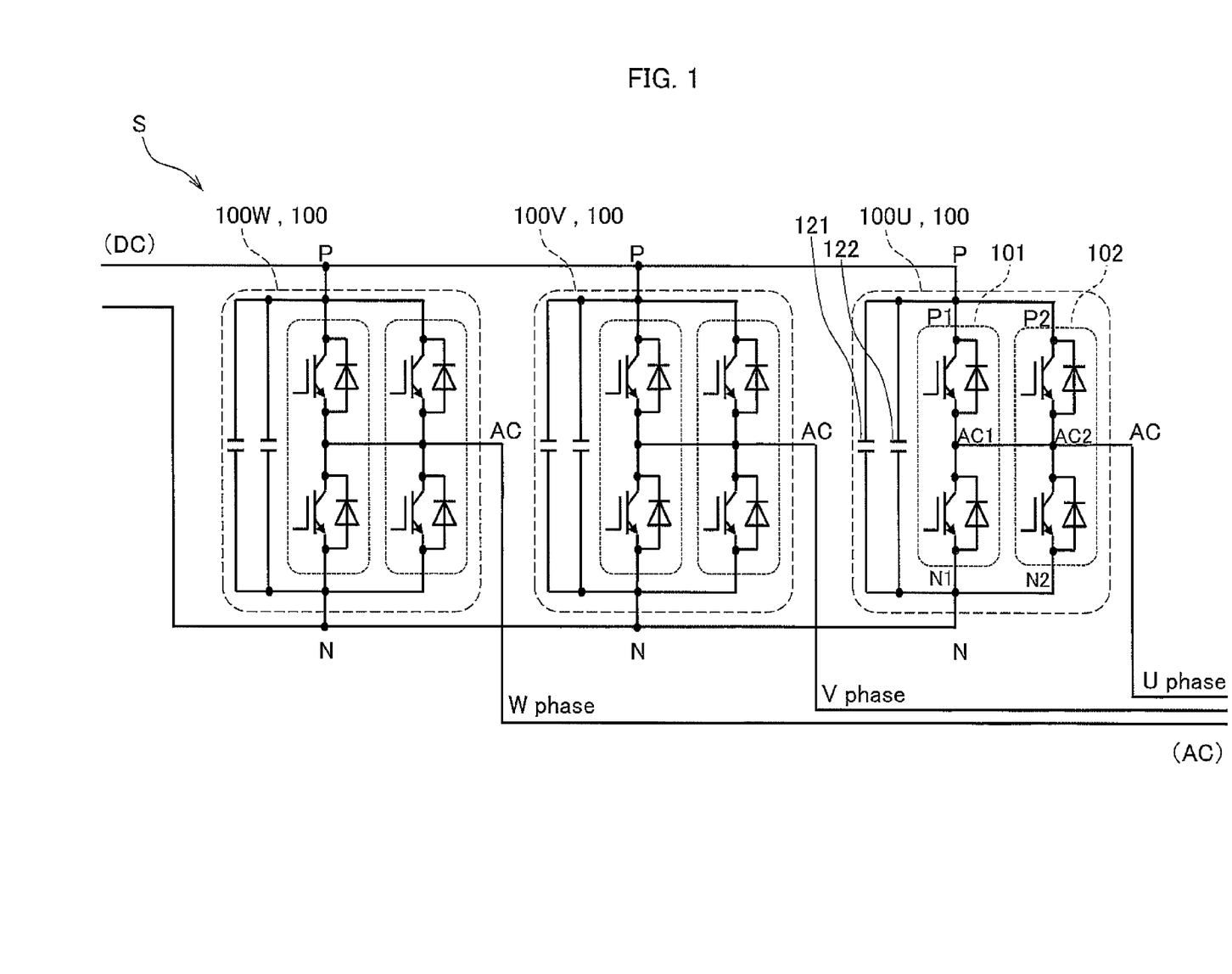
FIG. 1 is a circuit diagram showing an example of a power conversion device according to the first embodiment.

A power conversion device S according to the first embodiment is explained with reference to FIG. 1. FIG. 1 is a circuit diagram showing an example of a power conversion device according to the first embodiment. An inverter having a function of converting a DC current to a three-phase current, which corresponds to an example of the power conversion device S, is to be explained.

The power conversion device S for a conversion device is equipped with a U-phase power conversion unit 100U, a V-phase conversion unit 100V, a W-phase control unit 100W, a control unit (not shown) to control switching operation of a semiconductor element (IGBT) of each of the power conversion units 100U, 100V, 100W and a ventilating unit (not shown) to cool each of the power conversion units 100U, 100V, 100W. Since the U-phase power conversion unit 100U, the V-phase conversion unit 100V and the W-phase control unit 100W have similar structures to one another, a power conversion unit 100 used in the description below indicates any of the U-phase power conversion unit 100U, the V-phase conversion unit 100V and the W-phase control unit 100W unless distinction is made among them.

The power conversion unit 100 comprises semiconductor modules 101, 102 and condensers 121, 122, all of which are connected in parallel with one another. Each of these semiconductor modules 101, 102 and condensers 121, 122 has one end connected with a P-wire for the DC current and the other end connected with an N-wire for the DC current. Current capacity is increased with the semiconductor modules connected in parallel.

Each of the semiconductor modules has a circuit configuration in which a couple of hybrid IGBTs (semiconductor device) each having, for example, a fast recovery diode (FRD) are connected in series. Accordingly, the semiconductor module 101 has an upper side IGBT with a collector terminal connected with the P-wire (at P1) and a lower side IGBT with an emitter terminal connected with the N-wire (at N1). Both an emitter terminal of the upper side IGBT and a collector terminal of the lower side IGBT are connected with an AC-wire (AC1). Similarly, the semiconductor module 102 has an upper side IGBT with a collector terminal connected with the P-wire (at P2) and a lower side IGBT with an emitter terminal connected with the N-wire (at N2). Both an emitter terminal of the upper side IGBT and a collector terminal of the lower side IGBT are connected with an AC-wire (at AC2). Both the AC-wire (through AC1) of the semiconductor module 101 and the AC-wire (through AC2) of the semiconductor module 102 are connected with the AC-wire (AC) of the power conversion unit 100.

The control unit (not shown) is configured to control the switching operation of the semiconductor elements (IGBT) of the semiconductor modules 101, 102 included in each of the power conversion units 100 (100U, 100V, 100W). Accordingly the control means controls a gate voltage of IGBT. With this control, the power conversion device S is able to function as a conversion device to convert the DC current to the three-phase current.

<Power Conversion Unit 100>

Figure 2:
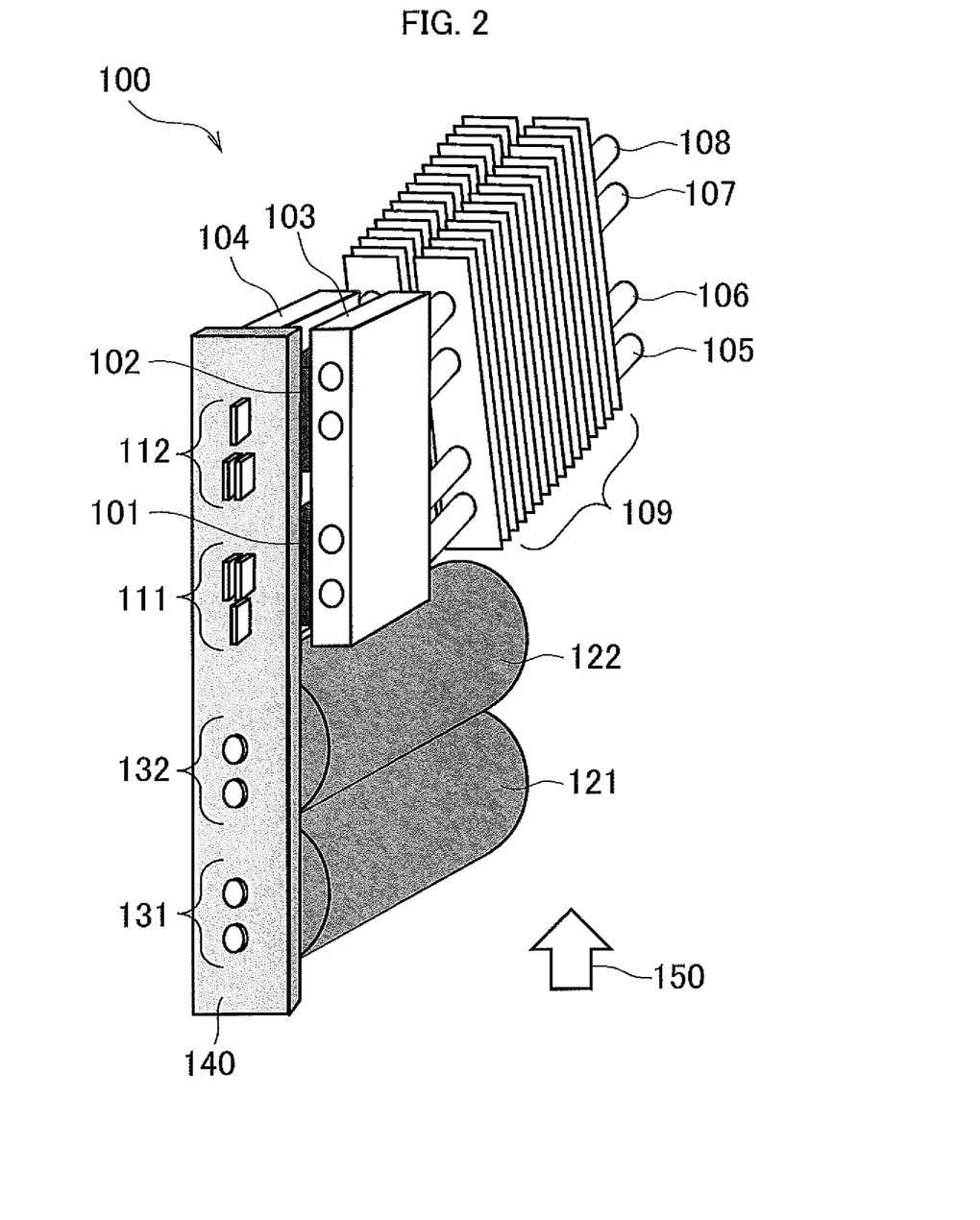
FIG. 2 is a perspective view of a power conversion unit according to the first embodiment.
Figure 3:
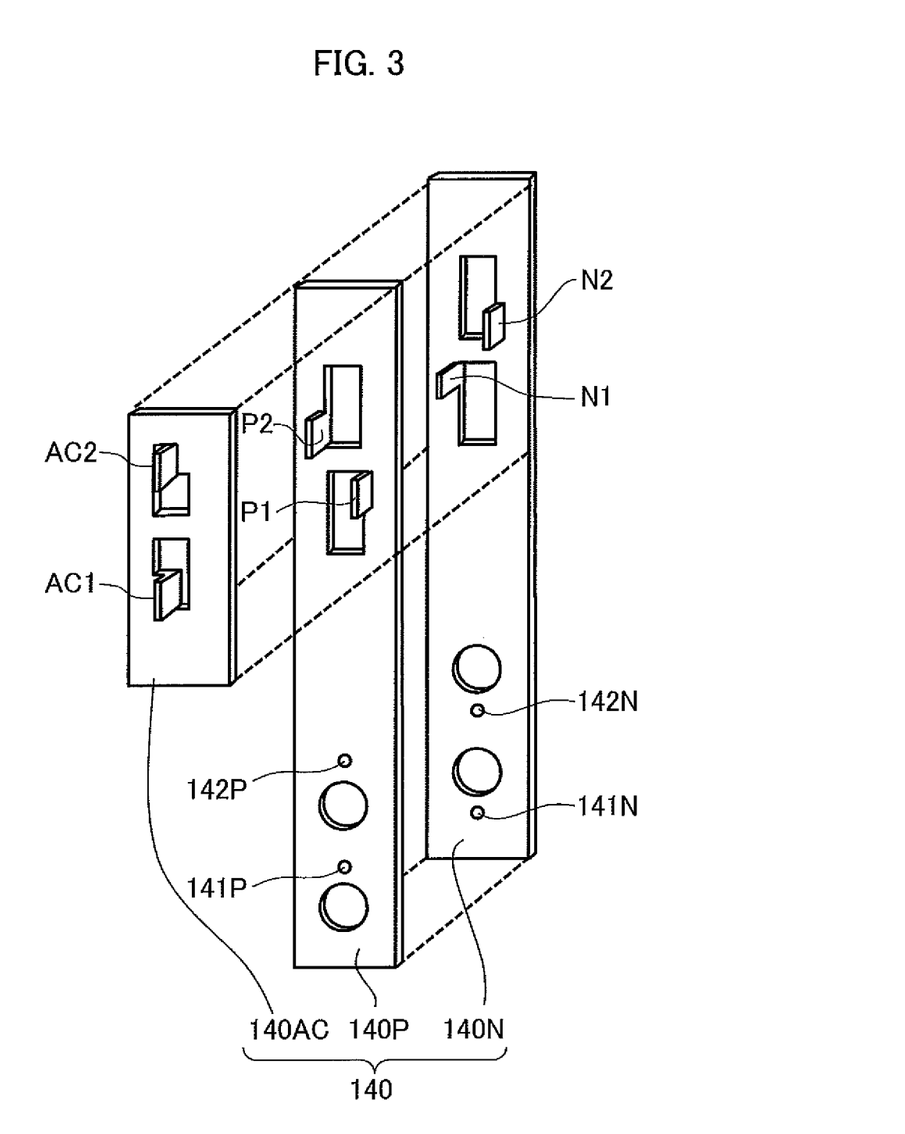
FIG. 3 is an exploded perspective view of a bus bar used for the power conversion unit.

A structure of the power conversion unit 100 of the power conversion device S according to the first embodiment is further explained with reference to FIG. 2 and FIG. 3. FIG. 2 is a perspective view of a power conversion unit 100 according to the first embodiment. FIG. 3 is an exploded perspective view of a bus bar 140 used for the power conversion unit 100.

As shown in FIG. 2, the power conversion unit 100 comprises semiconductor modules 101, 102, heat receiving blocks 103, 104, heat pipes 105 to 108, a fin 109, condensers 121, 122 and a bus bar 140. An arrow sign represented by a sign 150 indicates a direction in which cooling wind supplied by the cooling ventilation means (not shown) blows.

There are a couple of semiconductor modules 101,102 assembled into the power conversion device 100. Each of these semiconductor modules 101, 102 is of a two face cooling type and has heat dissipation faces on both sides. Heat receiving blocks 103, 104 are disposed in contact with the heat dissipation faces of the couple of semiconductor modules and heat generated in the semiconductor modules 101, 102 is transferred to the heat dissipation blocks 103, 104.

The heat receiving block 103 is disposed in contact with one of the heat dissipation faces of the semiconductor module 101 and one of the heat dissipation faces of the semiconductor module 102. There are four heat pipes 105 to 108 embedded in the heat dissipation block 103. There is a fin 109 that is fixed onto the heat pipes 105 to 108 and configured to dissipate heat to ambient air. Similarly the heat receiving block 104 is disposed in contact with the other of the heat dissipation faces of the semiconductor module 101 and the other of the heat dissipation faces of the semiconductor module 102. There are four heat pipes that are fixed onto the semiconductor module 102 and configured to dissipate heat into ambient air.

The semiconductor module 101 has a terminal 111 connected with the bus bar 140. Similarly the semiconductor module 102 has a terminal 112 connected with the bus bar 140. In addition, the condenser 121 has a terminal 131 connected with the bus bar 140. Similarly the condenser 122 has terminal 132 connected with the bus bar 140.

As shown in FIG. 3, the bus bar 140 includes a P-wire bus bar 140P, an N-wire bus bar 140N and an AC-wire bus bar 140AC. Adjacent bus bars are insulated with an insulation material or the like.

The P-wire bus bar 140P has a connection portion 141P with which one of the terminals of the condenser 121, a connection portion 142P with which one of the terminals of the condenser 122, a connection portion P1 with which the first terminal (collector terminal of the upper IGBT in FIG. 1) of the semiconductor module 101 and a connection portion P2 with which the first terminal (collector terminal of upper IGBT in FIG. 1) of the semiconductor module 102 is connected.

The N-wire bus bar 140N has a connection portion 141N with which the other of the terminals of the condenser 121 is connected, a connection portion 142N with which one of the terminals of the condenser 122 is connected, a connection portion N1 with which the second terminal (emitter terminal of lower IGBT in FIG. 1) of the semiconductor module 101 is connected, and a connection portion N2 with which the second terminal (emitter terminal of the lower IGBT in FIG. 1) of the semiconductor module 102 is connected.

The AC-wire bus bar 140AC has a connection portion AC1 with which the third terminal (emitter terminal of upper IGBT and collector terminal of lower IGBT in FIG. 1) of the semiconductor module 101 is connected and a connection portion AC2 with which the third terminal (emitter terminal of upper IGBT and collector terminal of lower IGBT in FIG. 1) of the semiconductor module 102 is connected.

As shown in FIG. 2 and FIG. 3, the semiconductor modules 101, 102 and the condensers 121, 122 are arranged in a line. Accordingly, as is seen in FIG. 3, distances from the connection portion P1 of the semiconductor module 101 to the connection portions 141P, 142P of the condensers 121, 122 are shorter than distances from the connection portion P2 of the semiconductor module 102 to the connection portions 141P, 142P of the condensers 121, 122. Similarly, distances from the connection portion N1 of the semiconductor module 101 to the connection portions 141N, 142N of the condensers 121, 122 are shorter than distances from the connection portion N2 of the semiconductor module 102 to the connection portions 141N, 142N of the condensers 121, 122.

As is described, the semiconductor module 101 is closer to the condensers 121, 122 than the semiconductor module 102 and an inductance and a resistance through the bus bar 140 are smaller for the semiconductor module 101. Accordingly, a larger electrical current flows through the semiconductor module 101 than through the semiconductor module 102 while the power conversion device S (power conversion unit 100) is in operation. As a result, a generated loss (corresponding to a generated heat) of the semiconductor module 101 is larger than a generated loss (corresponding to a generated heat) of the semiconductor module 102. Therefore, there is a variation in the generated heat between the semiconductor modules 101, 102.

In order to reduce the temperature variation between the semiconductor modules 101, 102 that results from the variation in the generated heat between the semiconductor modules 101, 102, the power conversion device S (power conversion unit 100) utilizes common heat receiving blocks 103, 104 disposed onto the couple of the semiconductor modules 101, 102.

As the above mentioned structure is used, heat generated from the semiconductor module 101 is transmitted to the semiconductor module 102 through the heat receiving blocks 103, 104. As a result, the heat generated from the semiconductor module 101 can be transmitted to the fin 109 not only through the heat pipes 105, 106 disposed on the side of the semiconductor module 101, but also through the heat pipes 107, 108 disposed on the side of the semiconductor module 102.

In addition, as is seen in the power conversion device S (power conversion unit 100) illustrated in FIG. 2, cooling wind blows in a direction 150 that corresponds to a direction from a lower side toward an upper side in FIG. 2. Accordingly, the cooling wind blows from the condensers 121, 122 toward the semiconductor modules 101, 102. In the other words, the cooling wind blows from the semiconductor module 101 that is disposed nearer to the condensers 121, 122 toward the semiconductor module 102 that is disposed farther from the condensers 121, 122.

According to this structure, the semiconductor module 101 is more efficiently cooled because the heat pipes 105, 106 to cool the semiconductor module 101 are arranged on the upwind side of the heat pipe 107, 108 to cool the semiconductor module 102.

As has been mentioned, the power conversion device S (power conversion unit 100) has the semiconductor modules 101, 102 and the condensers 121, 122 arranged in a line and there is a variation in the generated loss (generated heat) between the semiconductor modules 101, 102. However, since the semiconductor module 101 can be cooled more efficiently than the semiconductor module 102, the temperature variation between the semiconductor modules 101, 102 is reduced. Accordingly, the power conversion device S (power conversion unit 100) is more reliable.

Moreover, identical semiconductor modules to each other can be used for the semiconductor modules 101, 102 in the power conversion device S (power conversion unit 100) according to the first embodiment. As a result, it is not necessary to use semiconductor modules whose gate resistance differs from each other, as is the case with JP2011-120358A, and it is possible to prevent the number of components used for a power conversion device S from increasing and improve easiness for production and maintenance.

Furthermore the cooling wind blows in the direction 150 from the side of the condensers 121, 122 toward the side of the semiconductor modules 101, 102, which enables the cooling wind heated by generated heat by the semiconductor modules 101, 102 to be prevented from heating the condensers 121, 122.

In addition, since the semiconductor modules 101, 102 and the condensers 121, 122 are arranged in a line in the power conversion unit 100 of the power conversion device S according to the first embodiment, as shown in FIG. 2, it is possible to make the power conversion device S thinner, which contributes to making the size of the power conversion device S smaller.

Second Embodiment

Figure 4:
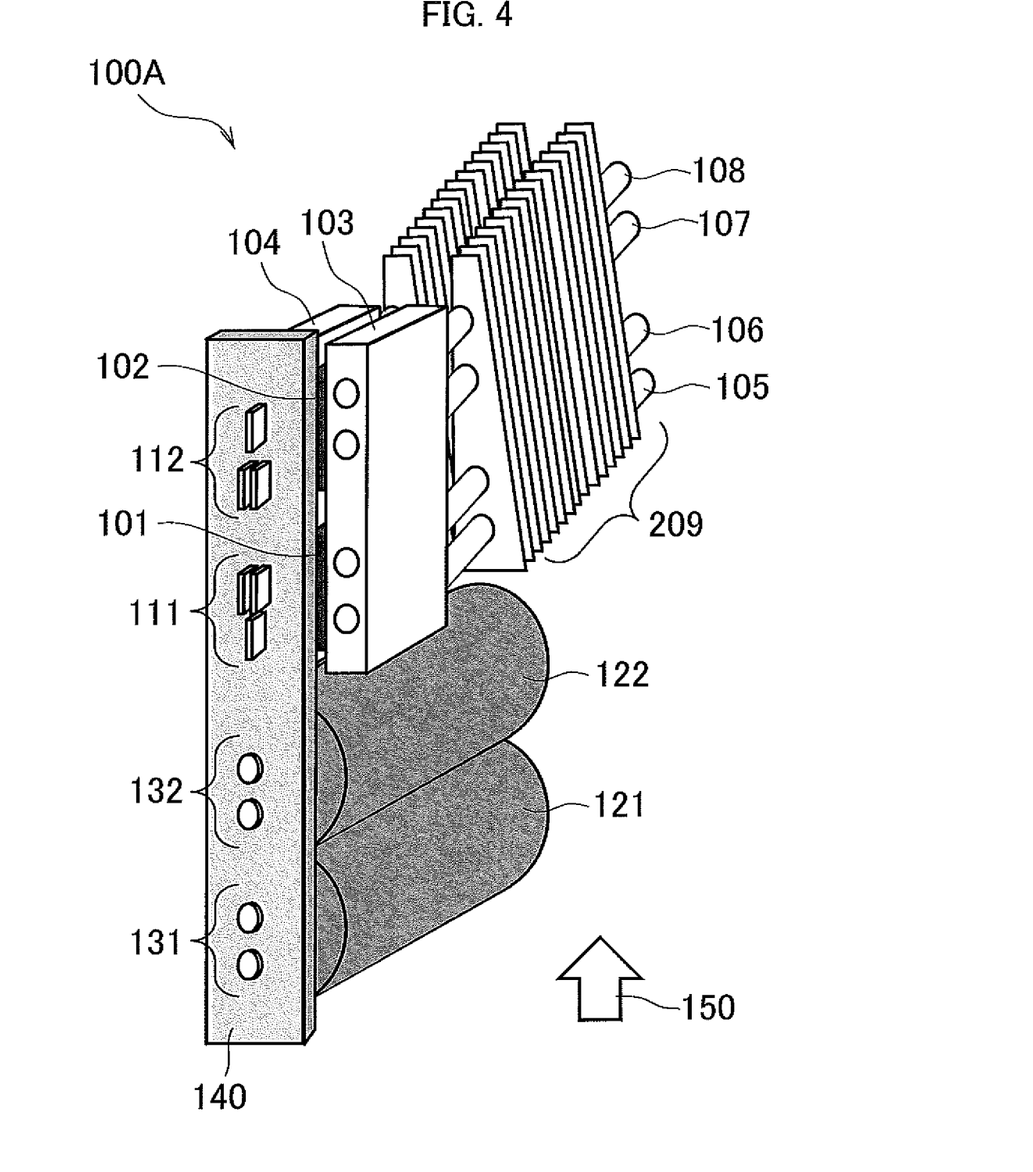
FIG. 4 is a perspective view of a power conversion unit according to the second embodiment.

Next, the power conversion device S of the second embodiment is explained. The power conversion device S of the second embodiment is different from the power conversion device S of the first embodiment in the configuration of the power conversion unit 100. More specifically, the power conversion device S of the second embodiment has a power conversion unit 100A (as illustrated in FIG. 4 below) with which the power conversion unit 100 (as shown in FIG. 1 and FIG. 2) is replaced in the power conversion device S of the first embodiment. The other elements are common between the power conversion devices S of the first embodiment and the second embodiment and not explained.

<Power Conversion Unit 100A>

A configuration of a power conversion unit 100A used for the power conversion device (inverter) S of the second embodiment is explained with reference to FIG. 4. FIG. 4 is a perspective view of a power conversion unit 100A according to the second embodiment.

As is shown in FIG. 4, the power conversion unit 100A includes semiconductor modules 101, 102, heat receiving blocks 103, 104, heat pipes 105 to 108, a fin 209, condensers 121, 122 and a bus bar 140. It is understood that the power conversion unit 100A of the second embodiment has the fin 209 whose shape is different from that of the fin 109 (as shown in FIG. 2) of the power conversion unit 100 of the first embodiment.

The fin 209 is joined to both the heat pipes 105, 106 which are configured to cool the semiconductor module 101 that generates more heat loss (generated heat) than the semiconductor module 102 and the heat pipes 107, 108 which are configured to cool the semiconductor module 102 that generates less heat loss. The fin 209 is configured to have a portion that is relatively closer to the heat pipes 105, 106 and has a larger width and the other portion that is relatively closer to heat pipes 107, 108 and has a smaller width.

Since the semiconductor module 101 can be cooled more efficiently than the semiconductor module 102 with the fin 209 used, this fin 209 has an effect of reducing the temperature difference between the semiconductor module 101, 102, which contributes to improving the reliability of the power conversion unit S with the power conversion unit 100A.

Third Embodiment

Figure 5:
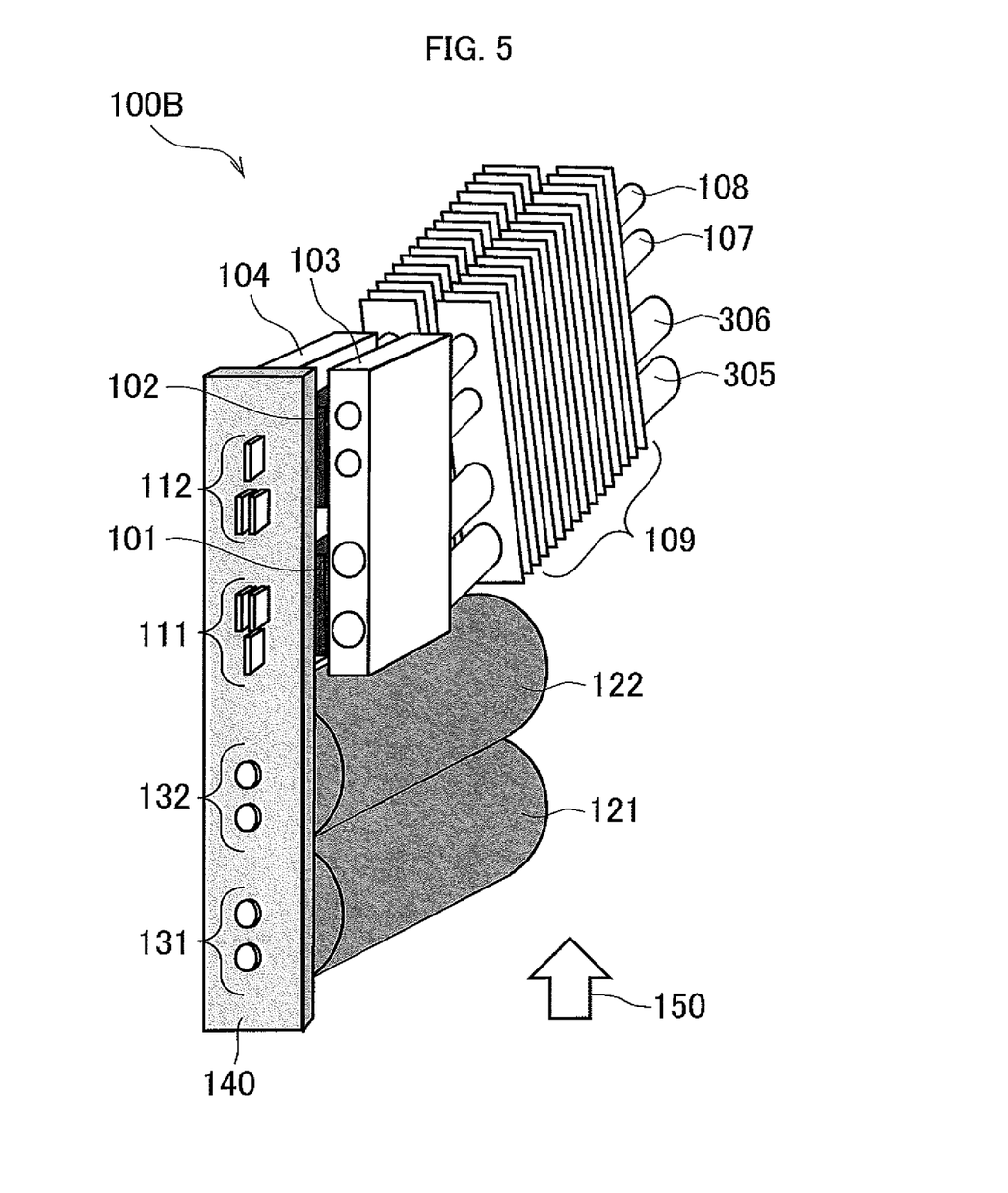
FIG. 5 is a perspective view of a power conversion unit according to the third embodiment.

Next, the power conversion device S of the third embodiment is explained. The power conversion device S of the third embodiment is different from the power conversion device S of the first embodiment in the configuration of the power conversion unit 100. More specifically, the power conversion device S of the third embodiment has a power conversion unit 100B (as illustrated in FIG. 5 below) with which the power conversion unit 100 (as shown in FIG. 1 and FIG. 2) is replaced in the power conversion device S of the first embodiment. The other elements are common between the power conversion devices S of the first embodiment and the third embodiment and not explained.

<Power Conversion Unit 100B>

A configuration of a power conversion unit 100B used for the power conversion device (inverter) S of the third embodiment is explained with reference to FIG. 5. FIG. 5 is a perspective view of a power conversion unit 100B according to the third embodiment.

As is shown in FIG. 5, the power conversion unit 100B includes semiconductor modules 101, 102, heat receiving blocks 103, 104, heat pipes 305, 306, heat pipes 107, 108, a fin 109, condensers 121, 122 and a bus bar 140. It is understood that the power conversion unit 100B has the heat pipes 305, 306 that are different from the heat pipes 105, 106 (as shown in FIG. 2) of the power conversion unit 100 of the first embodiment.

The heat pipes 305, 306 are configured to cool the semiconductor module 101 that generates more heat loss (generated heat) have a larger diameter than that of the heat pipes 107, 108 that generates less heat loss (generated heat).

Since the semiconductor module 101 can be cooled more efficiently than the semiconductor module 102 with the heat pipes 305, 306 used, these heat pipes 305, 306 have an effect of reducing the temperature difference between the semiconductor module 101, 102, which contributes to improving the reliability of the power conversion unit S with the power conversion unit 100B.

<Modification>

The power conversion devices S according to the present embodiments (first to third embodiments) is not be limited to configurations as have been explained above and there should be various modifications of the embodiments above explained which are within the scope of the present invention.

Although the power conversion device S of the present embodiment is assumed to be a converter in the embodiments above described, the power conversion device S of the present embodiment should not be limited to the inverter and can be applied to any type of the power conversion device that controls switching operation of semiconductor elements and alters a frequency of power or converts any of AC and DC power to the other.

Although there are a couple of condensers included in the power conversion unit 100 (100A, 100B) of the power conversion device S of the present embodiments as has been described, the number of the condensers to be included in the power conversion unit 100 is not limited to 2 and may be one or more than or equal to 3. In addition, the power conversion unit 100 (100A, 100B) of the power conversion device S includes a couple of semiconductor modules as has been described. However the number of the semiconductor modules should not be limited to 2 and may be more than or equal to 3.

Furthermore, each of the semiconductor modules 101, 102 is described as being a semiconductor module of a two face cooling type that has a heat dissipation face on each of its two faces, is not be limited to this type and may be of a one face cooling type. Moreover, each of the semiconductor modules 101, 102 is described as having a couple of hybrid IGBTs each having FRD which are connected in series as shown in FIG. 1. However, the semiconductor modules 101, 102 are not limited to what is described above and may be any type of a semiconductor module having semiconductor devices of which switching operation is controlled.

The heat pipes 305, 306 of the power conversion unit 100B of the power conversion device S according to the third embodiment are described as having a larger diameter than that of the heat pipes 107, 108 and not limited to this type. For example, the heat pipes 305, 306 may be made of a different material from a material of which the heat pipes 107, 108 are made of, the different material making a heat resistance smaller to increase an amount of transferred heat from the heat pipes 305, 306. The refrigerant used for the heat pipes 305, 307 may be a different one from that used for the heat pipes 107, 108 in order to transfer a larger amount of heat through the heat pipes 305, 307. These configurations have the same effect as the power conversion device S according to the third embodiment.

What is claimed is:

1. A power conversion device comprising:
   a condenser;
   a plurality of semiconductor modules;
   a heat dissipation unit for cooling the plurality of the semiconductor modules collectively;
   a bus bar connecting the condenser with the plurality of semiconductor modules; and
   a ventilation unit emitting a cooling wind flow;
   wherein the plurality of semiconductor modules are arranged apart from the condenser and in a line along a longitudinal direction of the bus bar, and the cooling wind flows in a direction from a first region where the condenser is mounted toward a second region where the plurality of semiconductor modules that are mounted, the first region being hotter than the second region.

2. The power conversion device as described in claim 1, wherein the heat dissipation unit comprises:
   a heat receiving block disposed in contact with the plurality of semiconductor modules;
   heat pipes fixed to the heat receiving block; and
   a fin joined to the heat pipes.

3. The power conversion device as described in claim 2, wherein the semiconductor modules include a first semiconductor module and a second semiconductor module, the first semiconductor module being closer to the condenser than the second semiconductor module is, the heat pipes include a first heat pipe to cool the first semiconductor module and a second heat pipe to cool the second semiconductor module, and a width of a first portion of the fin to which the first heat pipe is joined is larger than a width of a second portion of the fin to which the second heat pipe is joined.

4. The power conversion device as described in claim 2, wherein the semiconductor modules include a first semiconductor module and a second semiconductor module, the first semiconductor module being closer to the condenser than the second semiconductor module is, the heat pipes include a first heat pipe to cool the first semiconductor module and a second heat pipe to cool the second semiconductor module, and a diameter of the first heat pipe is larger than a diameter of the second heat pipe.

5. The power conversion device as described in claim 2, wherein the semiconductor modules include a first semiconductor module and a second semiconductor module, the first semiconductor module being closer to the condenser than the second semiconductor module is, the heat pipes include a first heat pipe to cool the first semiconductor module and a second heat pipe to cool the second semiconductor module, and the first heat pipe has a smaller heat conduction resistance than the second heat pipe and is capable of transferring a larger amount of heat than the second heat pipe.

6. A power conversion device comprising:
a condenser;
a plurality of semiconductor modules;
a heat dissipation unit for cooling the plurality of the semiconductor modules collectively;
a bus bar connecting the condenser with the plurality of semiconductor modules; and
a ventilation unit having cool wind blow, wherein
the plurality of semiconductor modules are arranged apart from the condenser and in a line in a longitudinal direction of the bus bar, and the cool wind blows in a direction from the condenser toward the plurality of semiconductor modules that are mounted, and
the heat dissipation unit comprises:
a heat receiving block disposed in contact with the plurality of semiconductor modules,
heat pipes fixed to the heat receiving block, and
a fin joined to the heat pipes.

7. The power conversion device as described in claim 6, wherein the semiconductor modules include a first semiconductor module and a second semiconductor module, the first semiconductor module being closer to the condenser than the second semiconductor module is, the heat pipes include a first heat pipe to cool the first semiconductor module and a second heat pipe to cool the second semiconductor module, and a width of a first portion of the fin to which the first heat pipe is joined is larger than a width of a second portion of the fin to which the second heat pipe is joined.

8. The power conversion device as described in claim 6, wherein the semiconductor modules include a first semiconductor module and a second semiconductor module, the first semiconductor module being closer to the condenser than the second semiconductor module is, the heat pipes include a first heat pipe to cool the first semiconductor module and a second heat pipe to cool the second semiconductor module, and a diameter of the first heat pipe is larger than a diameter of the second heat pipe.

9. The power conversion device as described in claim 6, wherein the semiconductor modules include a first semiconductor module and a second semiconductor module, the first semiconductor module being closer to the condenser than the second semiconductor module is, the heat pipes include a first heat pipe to cool the first semiconductor module and a second heat pipe to cool the second semiconductor module, and the first heat pipe has a smaller heat conduction resistance than the second heat pipe and is capable of transferring a larger amount of heat than the second heat pipe.

* * * * *